United States Patent
Kim et al.

(10) Patent No.: US 8,253,025 B2
(45) Date of Patent: Aug. 28, 2012

(54) PRINTED CIRCUIT BOARD HAVING ELECTROMAGNETIC BANDGAP STRUCTURE

(75) Inventors: Han Kim, Yongin-si (KR); Mi-Ja Han, Junjoo-si (KR); Dae-Hyun Park, Woolsan-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 383 days.

(21) Appl. No.: 12/654,307

(22) Filed: Dec. 16, 2009

(65) Prior Publication Data

US 2011/0061925 A1  Mar. 17, 2011

(30) Foreign Application Priority Data

Sep. 16, 2009  (KR) .................. 10-2009-0087645

(51) Int. Cl.
*H05K 9/00* (2006.01)
(52) U.S. Cl. ........ 174/250; 174/255; 361/763; 361/777; 361/780; 333/206; 343/700 MS; 343/756; 257/532; 257/665
(58) Field of Classification Search .......... 174/250–767; 361/782, 784, 772, 765, 763, 794, 764, 788, 361/762, 760; 333/12, 167, 185, 246, 202, 333/204, 212; 343/909, 700 MS, 729, 767, 343/762, 771; 257/532, 665, 697, 724, 786
See application file for complete search history.

(56) References Cited

U.S. PATENT DOCUMENTS

| | | | |
|---|---|---|---|
| 5,428,506 A * | 6/1995 | Brown et al. | 361/794 |
| 6,166,457 A * | 12/2000 | Iguchi et al. | 307/91 |
| 6,198,362 B1 * | 3/2001 | Harada et al. | 333/12 |
| 6,215,372 B1 * | 4/2001 | Novak | 333/12 |
| 6,297,965 B1 * | 10/2001 | Sasaki et al. | 361/782 |
| 6,329,604 B1 * | 12/2001 | Koya | 174/255 |
| 6,337,798 B1 * | 1/2002 | Hailey et al. | 361/763 |
| 6,353,540 B1 * | 3/2002 | Akiba et al. | 361/794 |
| 6,483,045 B1 * | 11/2002 | Wang et al. | 174/264 |
| 6,798,666 B1 * | 9/2004 | Alexander et al. | 361/766 |
| 6,833,512 B2 * | 12/2004 | Liu | 174/262 |
| 7,016,198 B2 * | 3/2006 | Fessler et al. | 361/780 |
| 7,215,007 B2 * | 5/2007 | McKinzie et al. | 257/664 |
| 7,417,869 B1 * | 8/2008 | Lam | 361/763 |
| 7,466,560 B2 * | 12/2008 | Hayashi et al. | 361/784 |
| 7,586,444 B2 * | 9/2009 | Berlin et al. | 343/700 MS |
| 7,663,892 B2 * | 2/2010 | Choi et al. | 361/763 |
| 7,675,729 B2 * | 3/2010 | Anthony et al. | 361/118 |
| 7,843,702 B2 * | 11/2010 | Choi et al. | 361/763 |
| 7,889,134 B2 * | 2/2011 | McKinzie et al. | 343/700 MS |
| 7,944,320 B2 * | 5/2011 | Han et al. | 333/12 |
| 8,004,369 B2 * | 8/2011 | Kwon et al. | 333/12 |
| 8,102,219 B2 * | 1/2012 | Koo et al. | 333/12 |

(Continued)

FOREIGN PATENT DOCUMENTS

KR  10-2009-0014950  2/2009

*Primary Examiner* — Michail V Datskovskiy

(57) ABSTRACT

Disclosed is a printed circuit board including an electromagnetic bandgap structure. The electromagnetic bandgap structure for blocking a noise is inserted into the printed circuit board. The electromagnetic bandgap structure can include a first conductive plate; a second conductive plate arranged on a planar surface that is different from that of the first conductive plate; a third conductive plate arranged on a planar surface that is different from that of the second conductive plate; and a stitching via unit configured to connect the first conductive plate and the third conductive plate by bypassing the planar surface on which the second conductive plate is arranged and including a first inductor element.

3 Claims, 7 Drawing Sheets

U.S. PATENT DOCUMENTS

| | | | |
|---|---|---|---|
| 2002/0008314 A1* | 1/2002 | Takeuchi | 257/697 |
| 2005/0029632 A1* | 2/2005 | McKinzie et al. | 257/665 |
| 2005/0104678 A1* | 5/2005 | Shahparnia et al. | 333/12 |
| 2005/0134522 A1* | 6/2005 | Waltho | 343/909 |
| 2005/0205292 A1* | 9/2005 | Rogers et al. | 174/255 |
| 2005/0224912 A1 | 10/2005 | Rogers et al. | |
| 2007/0001926 A1* | 1/2007 | Waltho | 343/909 |
| 2007/0090398 A1* | 4/2007 | McKinzie, III | 257/192 |
| 2007/0289771 A1* | 12/2007 | Osaka et al. | 174/250 |
| 2009/0002952 A1* | 1/2009 | Mesmer et al. | 361/720 |
| 2009/0038840 A1* | 2/2009 | Kim et al. | 174/376 |
| 2009/0039984 A1* | 2/2009 | Kim et al. | 333/212 |
| 2009/0184782 A1* | 7/2009 | Koo et al. | 333/204 |
| 2009/0236141 A1* | 9/2009 | Kim et al. | 174/360 |
| 2009/0322450 A1* | 12/2009 | Kim et al. | 333/204 |
| 2010/0108373 A1* | 5/2010 | Park | 174/376 |

* cited by examiner

PRINTED CIRCUIT BOARD HAVING ELECTROMAGNETIC BANDGAP STRUCTURE

CROSS-REFERENCE TO RELATED PATENT APPLICATIONS

This application claims the benefit of Korean Patent Application No. 10-2009-0087645, filed on Sep. 16, 2009, in the Korean Intellectual Property Office, the disclosure of which is incorporated herein in its entirety by reference.

BACKGROUND OF THE INVENTION

1. Field of the Invention

The present invention relates to a substrate, more specifically to a noise reducing substrate capable of reducing a noise by using an EBG structure.

2. Background Art

As the operation frequencies of electronic products get higher, the electromagnetic interference (EMI) has been considered as one the chronic noise problems. Especially, the operation frequencies of the electronic products have recently been in a range of several tens MHz to several GHz, and thus it is significantly needed to solve the EMI problem. Specifically, since there has been little study on the solution to a noise generated at an edge of the substrate as the EMI problem of substrate, it is difficult to completely block the noises at the substrate.

The noise problem is caused by an EMI noise, which is the interference between electromagnetic (EM) waves generated at any one of electronic circuits, devices, parts and/or the like and other EM waves generated at another one. As shown in FIG. 1, the EMI noise can be roughly classified into a radiation noise and a conduction noise.

The radiation noise transferred to an upper side (i.e., the mounting surface of an electronic part) of a substrate can be typically prevented by shielding the upper side of the substrate with an electromagnetic protective cap such as a metal cap. In contrast, it is not as easy to prevent the conduction noise. Furthermore, the operation frequencies of digital electronic products get higher, causing the digital electronic products more complex, and thus it is difficult to find the solution.

SUMMARY

The present invention provides an EMI noise reducing printed circuit board capable of getting advantages in view of spatial configuration, manufacturing cost, and power consumption, by easily reducing noises having more various frequency bands with an inductor element.

An aspect of the present invention features a printed circuit board into which an electromagnetic bandgap structure for blocking a noise is inserted. The electromagnetic bandgap structure can include: a first conductive plate; a second conductive plate arranged on a planar surface that is different from that of the first conductive plate; a third conductive plate arranged on a planar surface that is different from that of the second conductive plate; and a first stitching via unit configured to connect the first conductive plate and the third conductive plate by bypassing the planar surface on which the second conductive plate is arranged and including a first inductor element.

The stitching via unit can include: a wire unit that is be arranged on the same planar surface as the second conductive plate but electrically separated from the second conductive plate and has the first inductor element; a first via configured to electrically connect one end of the wire unit to the first conductive plate; and a second via configured to electrically connect the other end of the wire unit to the second conductive plate.

The printed circuit board can also include: a fourth conductive plate arranged on a planar surface that is opposite to a planar surface where the second conductive plate is arranged with respect to the first conductive plate; a fifth conductive plate arranged on a same planar surface as the third conductive plate; and a second stitching via unit configured to connect the third conductive plate to the fifth conductive plate by bypassing the planar surface where the fourth conductive plate is arranged and including a second inductor element.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Throughout the description of the present invention, when describing a certain technology is determined to evade the point of the present invention, the pertinent detailed description will be omitted. Terms such as "first" and "second" can be used in describing various elements, but the above elements shall not be restricted to the above terms. The above terms are used only to distinguish one element from the other.

Figure 1:
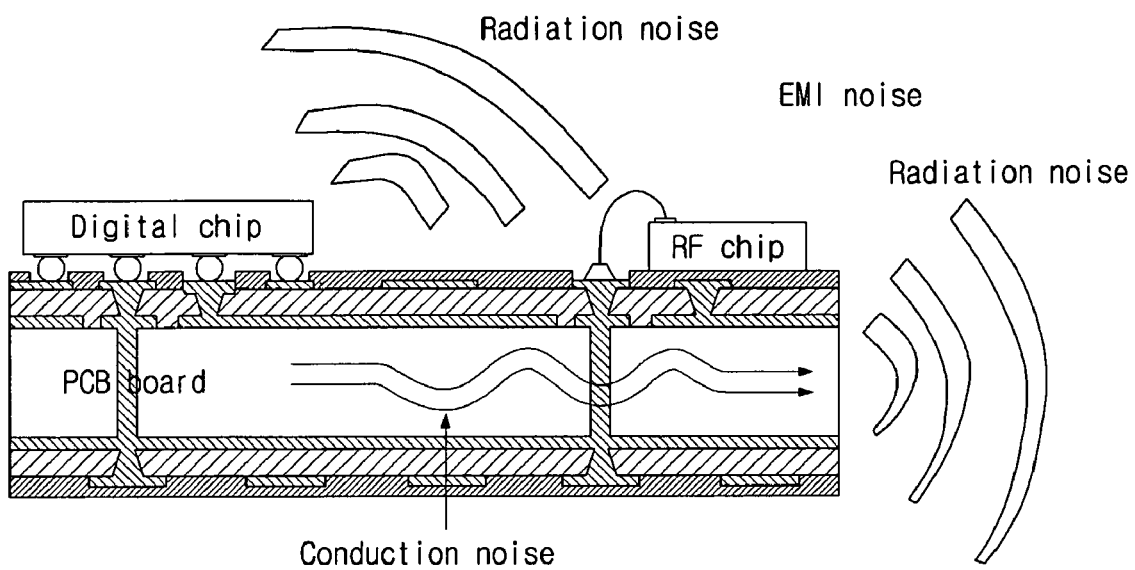
FIG. 1 shows how noises are transferred in a printed circuit board.

A printed circuit board in accordance with an embodiment of the present invention, as shown in FIG. 1, includes an electromagnetic bandgap structure to prevent an electromagnetic wave generated at any one of electronic circuits, devices and the like (e.g., digital chips) from being transferred to another one of electronic circuits, devices and the like (e.g., radio frequency (RF) chips). That is, such a noise is blocked by the electromagnetic bandgap structure included in the printed, circuit board.

The electromagnetic bandgap structure can include: a first conductive plate 10; a second conductive plate 20 arranged on a planar surface that is different from that of the first conductive plate 10; a third conductive plate 30 arranged on a planar surface that is different from that of the second conductive plate 20; and a first stitching via unit 90 connecting the first conductive plate 10 to the third conductive plate 30 through the planar surface on which the second conductive plate 20 is arranged.

Here, the first stitching via unit 90 can include a first inductor element 94, and the first stitching via unit 90 can be electrically separated from the second conductive plate 20 by a clearance hole formed on the second conductive plate 20.

It is possible to easily, variously change the characteristics of the electromagnetic bandgap functioning as a filter circuit by allowing the first inductor element 94 to be included in the first stitching via unit 90. Such characteristics will be described later in more detail.

The electromagnetic bandgap structure may be adequately arranged in one line or two or more lines at any position where the conductive noise is needed to be blocked.

Figure 2:
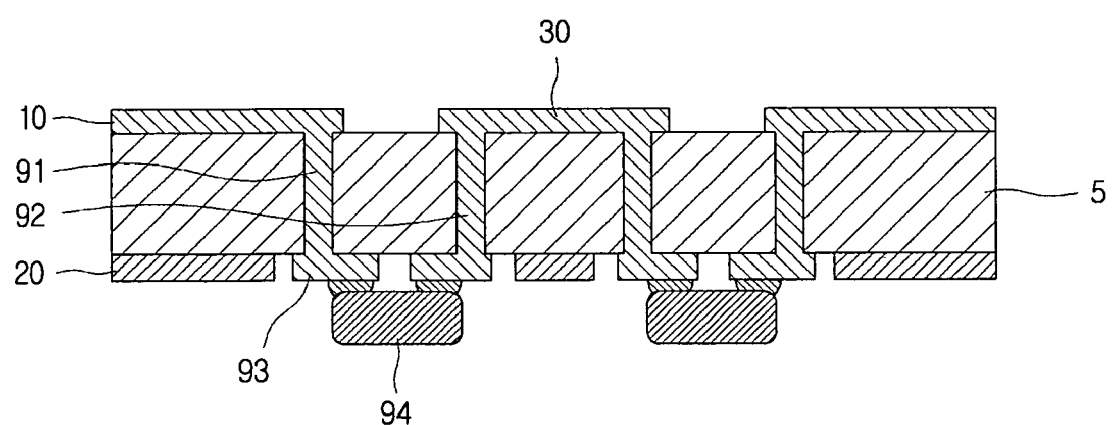
FIG. 2 is a cross sectional view showing a printed circuit board including an electromagnetic bandgap structure in accordance with an embodiment of the present invention.
Figure 4:
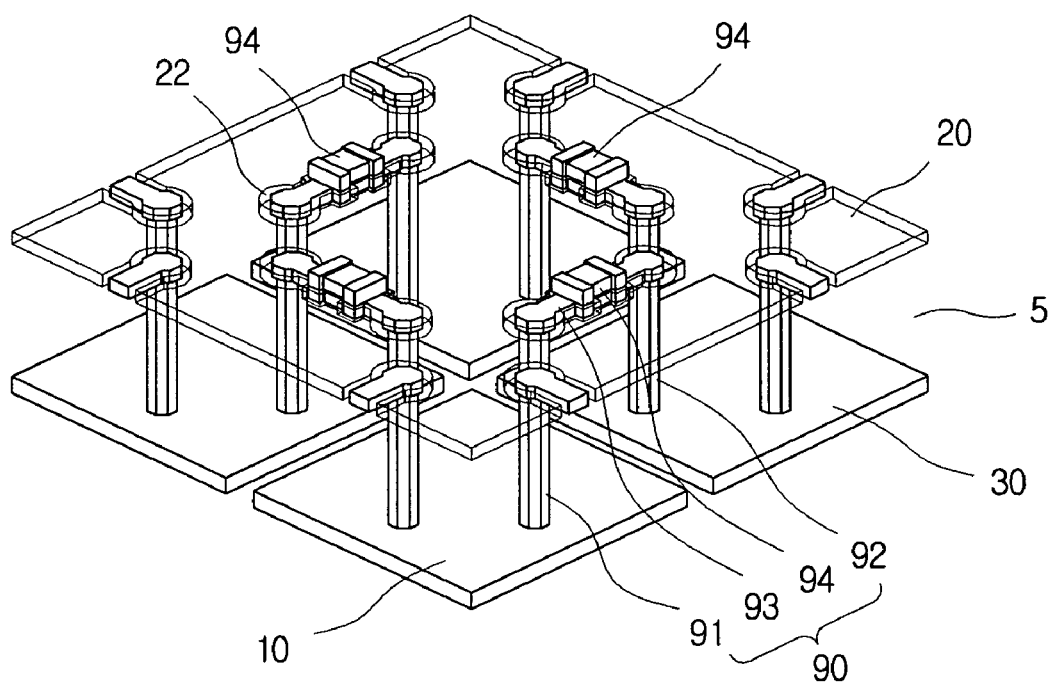
FIG. 4 is a perspective view showing the printed circuit board in accordance with the embodiment of the present invention.

As shown in FIGS. 2 and 4, the first stitching via unit 90 can include: a wire unit 93 arranged on a same planar surface as the second conductive plate 20 and including the first inductor element 94; a first via 91 electrically connecting one end of the wire unit 93 to the first conductive plate 10; and a second via electrically connecting the other end of the wire unit 93 to the second conductive plate 20. In such a structure, it is possible to allow the first inductor element 94 to be included in the stitching via unit 90 by simply mounting the first inductor element 94 on a surface of the wire unit 93.

Described below is the principle by which the structure shown in FIGS. 2 and 4 can function as the electromagnetic bandgap structure blocking a signal of a certain frequency band.

A dielectric layer 5 can be interposed between the first conductive plate 10 and the third conductive plate 30. This may cause a capacitance component to be formed between the second conductive plate 20 and the first and third conductive plates 10 and 30 and between the adjacent two conductive plates 10 and 30. Moreover, there can be an inductance component connecting through the first via 91→the wire unit 93 and the first inductor element 94→the second via 92 between the adjacent two conductive plates 10 and 30 by the first stitching via unit 90.

At this time, the value of the capacitance component can be varied according to various factors such as the spaced distances between the second conductive plate 20 and the first and third conductive plates 10 and 30 and between the adjacent two conductive plates 10 and 30, the permittivity of a dielectric material constituting the dielectric layer 5 and the size, shape and area of conductive plate, etc.

The value of the inductance component can be also varied according to various factors, such as the shape, length, depth, width and area of the vias 91 and 92, the wire unit 93, and/or the first inductor element 94. Accordingly, adjusting and designing various aforementioned factors adequately can make it possible to allow the structure of FIG. 2 to function as the electromagnetic bandgap structure (i.e. a band stop filter) for removing or blocking a certain noise or a certain signal of a target frequency band. This can be easily understood through the equivalent circuit of FIG. 3.

Figure 3:
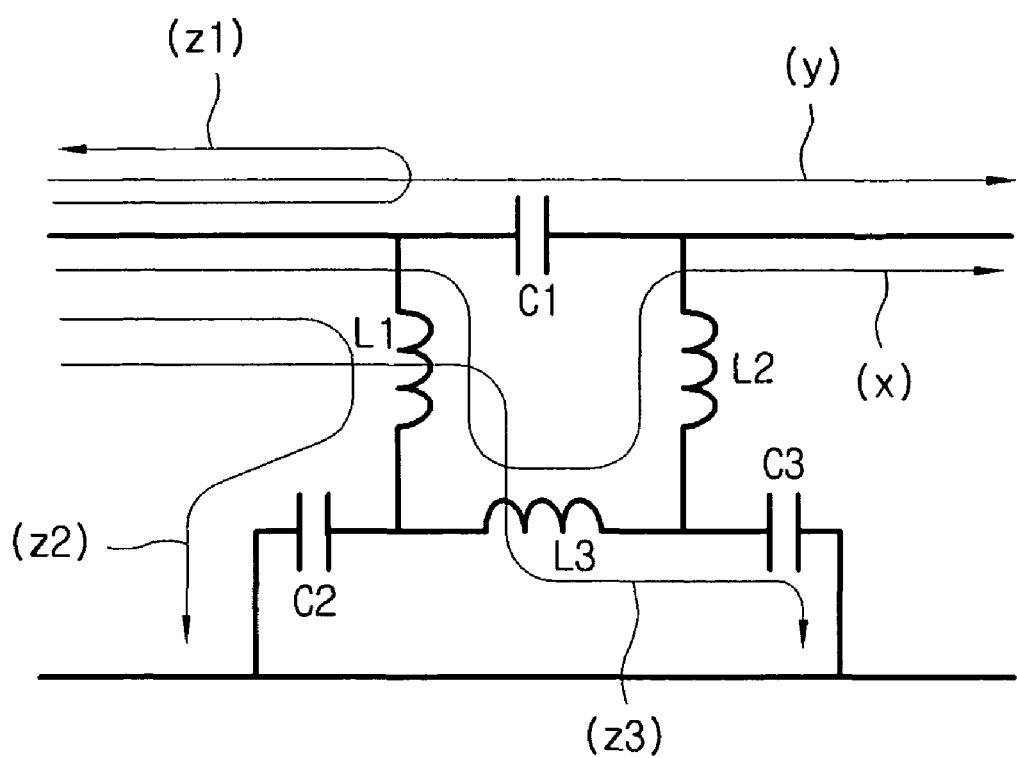
FIG. 3 shows an equivalent circuit of the electromagnetic bandgap structure of FIG. 2.

Comparing the equivalent circuit of FIG. 3 with the electromagnetic bandgap structure of FIG. 2, an inductance component L1 can correspond to the first via 91, and an inductance component L2 can correspond to the second via 92. An inductance component L3 can correspond to the wire unit 93 and the first inductor element 94. C1 can be a capacitance component by the first and third conductive plates 10 and 30 and another dielectric layer and the second conductive plate 20 to be placed above the first and third conductive plates 10 and 30. C2 and C3 can be capacitance components by the second conductive plate 20 placed on the same planar surface as the wire unit 93 and another dielectric layer and the second conductive plate 20 to be placed below the planar surface of the wire unit 93.

As shown in the equivalent circuit of FIG. 3, the electromagnetic bandgap structure shown in FIG. 2 can function as a band stop filter, which blocks a signal of a certain frequency band according to the above equivalent circuit.

In accordance with the present embodiment, since the inductance component L3 can be freely varied by connecting the first inductor element 94 to the first stitching via unit 90, it is possible to realize a stopband characteristic at a low frequency band without changing the size. Further, it is possible to obtain several stopband frequencies and widen the bandwidth of the blockable frequencies by mounting inductor elements having various inductance values.

FIG. 4 shows that the electromagnetic bandgap structures are repeatedly arranged. Here, the second conductive plate 20 is formed with the clearance hole 22 so that the first stitching via unit 90 can be electrically separated. That is, the wire unit 93 can be electrically separated from the second conductive plate 20.

Figure 5:
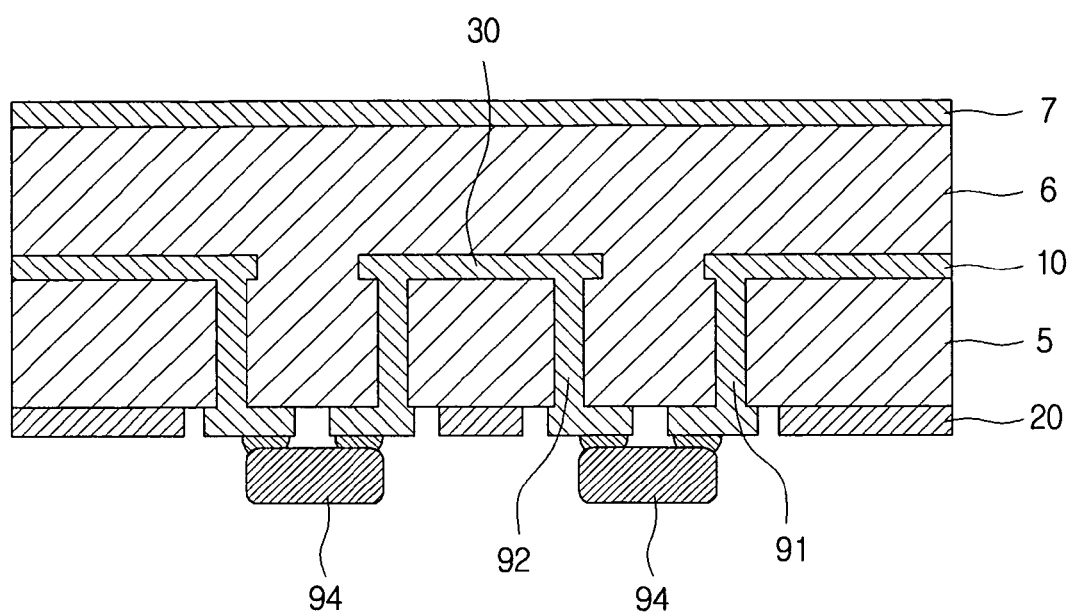
FIGS. 5 to 7 are cross sectional views showing a printed circuit board including an electromagnetic bandgap structure in accordance with other embodiments of the present invention.

As described above, FIGS. 2 and 4 shows the electromagnetic bandgap structure inserted into the printed circuit board having the 2-layered structure. Alternatively, as shown in FIG. 3, the electromagnetic bandgap structure may be inserted into the printed circuit board having a multi-layered (3 or more) structure. In FIG. 5, the reference numerals 6 and 7 refer to a dielectric layer and an additional conductive layer, respectively.

Figure 6:
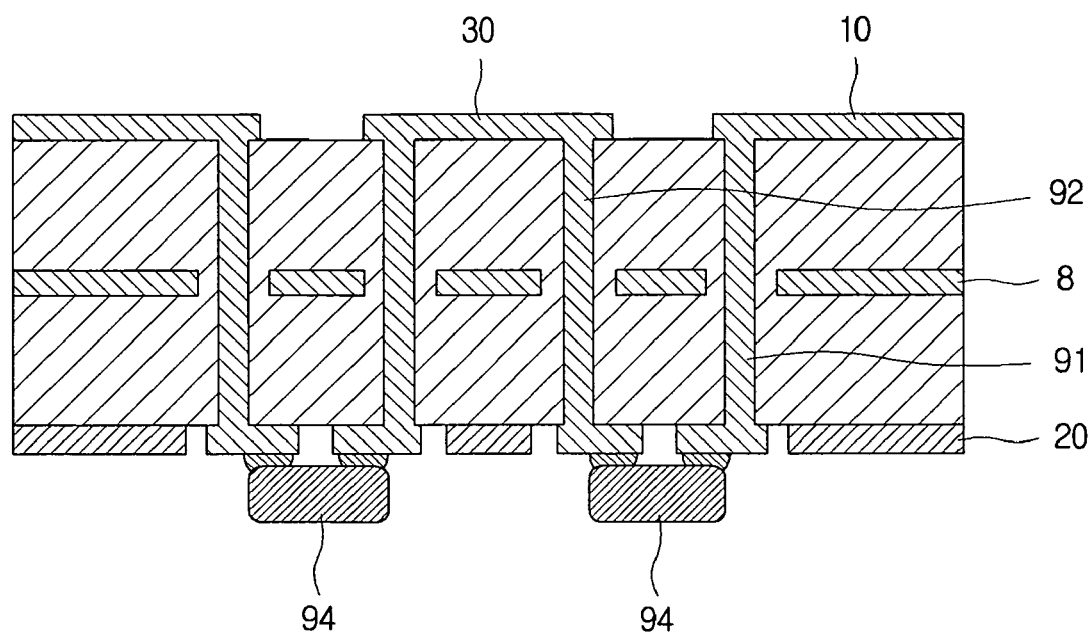

Alternatively, as shown in FIG. 6, an additional conductive layer 8 may be provided between the first and second conductive plates 10 and 20 such that the vias 91 and 92 extend through the conductive layer 8.

Figure 7:
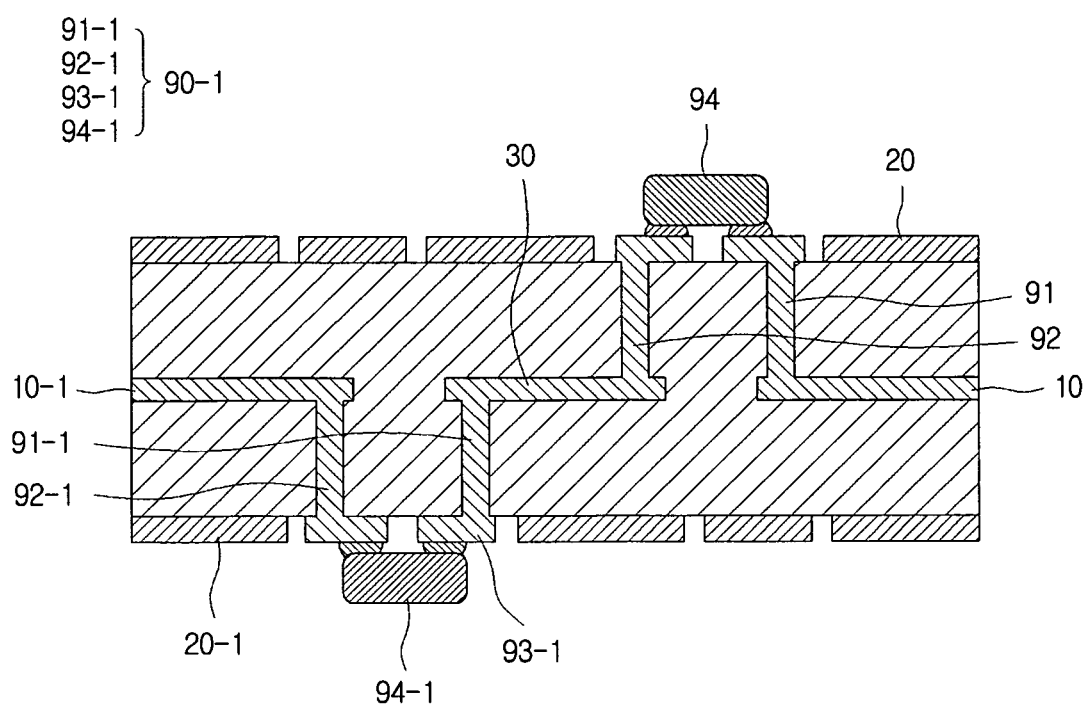

In an another alternative example, as shown in FIG. 7, the electromagnetic bandgap structure may further include: a fourth conductive plate 20-1 arranged on a planar surface that is opposite to a planar surface where the second conductive plate 20 is arranged with regard to the first conductive plate 10; a fifth conductive plate 10-1 arranged on a same planar surface as the third conductive plate 30; and a second stitching via unit 90-1 connecting the third conductive plate 30 to the fifth conductive plate 10-1 through the planar surface where the fourth conductive plate 20-1 and including a second inductor element 94-1. In this case, the second inductor element 94-1 may be mounted on a surface of an additional wire unit 93-1.

In other words, when the printed circuit board has a multi-layered (3 or more) structure, some (e.g., 94) of a plurality of inductor elements may be mounted in an upper direction of the printed circuit board, and some (e.g., 94-1) of the inductor elements may be mounted in a lower direction thereof. In such a structure, by using opposite surfaces of the printed circuit board, it is possible to improve the freedom of design of the electromagnetic bandgap structure, thereby realizing a filter having more various frequency characteristics.

All the aforementioned conductive plates may have a regular size and a certain shape. Alternatively, the conductive plates may have different sizes and different shapes as necessary in the designs or the like.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

Many other embodiments can be included in the scope of claims of the present invention.

What is claimed is:

1. A printed circuit board into which an electromagnetic bandgap structure for blocking a noise is inserted, the electromagnetic bandgap structure comprising:

a first conductive plate;

a second conductive plate arranged on a planar surface that is different from that of the first conductive plate;

a third conductive plate arranged on a planar surface that is different from that of the second conductive plate; and a first stitching via unit configured to connect the first conductive plate and the third conductive plate by bypassing the planar surface on which the second conductive plate is arranged and including a first inductor element.

2. The printed circuit board of claim 1, wherein the first stitching via unit comprises:

a wire unit, arranged on the same planar surface as the second conductive plate but electrically separated from the second conductive plate and including the first inductor element;

a first via configured to electrically connect one end of the wire unit to the first conductive plate; and a second via configured to electrically connect the other end of the wire unit to the third conductive plate.

3. The printed circuit board of claim 1, further comprising:

a fourth conductive plate arranged on a planar surface that is opposite to a planar surface where the second conductive plate is arranged with respect to the first conductive plate;

a fifth conductive plate arranged on a same planar surface as the third conductive plate; and a second stitching via unit configured to connect the third conductive plate to the fifth conductive plate by bypassing the planar surface where the fourth conductive plate is arranged and including a second inductor element.

* * * * *